(12) United States Patent
Wisniewski

(10) Patent No.: US 7,628,948 B2
(45) Date of Patent: Dec. 8, 2009

(54) ALTERNATE VENT HOLE SEALING METHOD

(75) Inventor: Andrew J. Wisniewski, South Lyon, MI (US)

(73) Assignee: Continental Automotive Systems US, Inc., Auburn Hills, MI (US)

( * ) Notice: Subject to any disclaimer, the term of this patent is extended or adjusted under 35 U.S.C. 154(b) by 865 days.

(21) Appl. No.: 11/144,282

(22) Filed: Jun. 3, 2005

(65) Prior Publication Data

US 2005/0285307 A1    Dec. 29, 2005

Related U.S. Application Data

(60) Provisional application No. 60/583,265, filed on Jun. 24, 2004.

(51) Int. Cl.
*B29C 31/00*    (2006.01)

(52) U.S. Cl. .............................. 264/272.11; 264/272.17

(58) Field of Classification Search ............ 264/272.11, 264/272.13–272.15, 272.17, 101–102, 275, 264/279; 425/812, DIG. 60
See application file for complete search history.

(56) References Cited

U.S. PATENT DOCUMENTS

| | | | | |
|---|---|---|---|---|
| 3,081,492 A | * | 3/1963 | Grzegorczyk | ............... 425/130 |
| 3,153,694 A | * | 10/1964 | Tomlinson | ................... 174/565 |
| 3,575,546 A | * | 4/1971 | Liautaud | ..................... 257/687 |
| RE28,683 E | * | 1/1976 | Kupsky | ...................... 345/215 |
| 4,796,464 A | * | 1/1989 | Miller | ..................... 73/114.57 |
| 5,506,446 A | * | 4/1996 | Hoffman et al. | ............. 257/674 |
| 6,094,354 A | * | 7/2000 | Nakajoh et al. | ............. 361/760 |
| 6,311,561 B1 | * | 11/2001 | Bang et al. | .................... 73/708 |

* cited by examiner

*Primary Examiner*—Philip C Tucker
*Assistant Examiner*—Xue Liu

(57) ABSTRACT

A method of assembling and sealing a circuit board within a housing includes the steps of placing the circuit board within the housing, filling the space above the circuit board or around the circuit board with a potting material, and then exhausting that cavity of gases during a curing process of the potting material. Exhausting of the gases is performed and accommodated by a vent opening. An access opening is in communication with the vent opening and provides for the injection of sealant to block the vent opening.

11 Claims, 2 Drawing Sheets

ALTERNATE VENT HOLE SEALING METHOD

CROSS REFERENCE TO RELATED APPLICATION

The application claims priority to U.S. Provisional Application No. 60/583,265 which was filed on Jun. 24, 2004.

BACKGROUND OF THE INVENTION

A printed circuit board (PCB) is a delicate device that is susceptible to damage if not adequately protected. PCBs that are utilized in automotive applications are protected by being installed and mounted within a housing. The housing can be fabricated from many different materials based on the location in which the PCB will be located and the application for which the PCB is used.

Typically, a PCB is placed within a housing and then sealed with a potting material to prevent contamination or moisture from affecting operation. The potting material is typically a liquid plastic material that hardens through a heat curing process. In some instances the potting material may consist of an epoxy that is mixed with a hardening agent. Use of either type of potting material generates heat that can generate gases. The gases must be exhausted to prevent degradation to the potting material. Preferably, gases are exhausted in a controlled manner and not merely allowed to bubble up through the potting material. Accordingly, a housing is typically provided with a vent opening that provides for the exhaust of the generated gases.

Disadvantageously, the vent opening provides a path for moisture and other contaminants to enter the housing and the cavity within which the PCB is located. The vent opening typically is open to a portion of the housing that will be plugged from contact with the environment, such as for example within a connector housing. In this way, the seal for the connector will also prevent moisture from intruding into the sealed housing. However, in some applications it is desirable to further seal the vent opening. Sealing a vent opening within a connector requires insertion of a tool that can undesirably contact and possibly dislodge electrical connections disposed within the connector.

Accordingly, it is desirable to develop a venting method and device to provide for exhausting gases that is capable of being sealed without interfering with desired electrical connections.

SUMMARY OF THE INVENTION

An example method and housing according to this invention protects a printed circuit board (PCB) and provides for the exhaust of gases generated during curing. The housing and method of this invention also provides for the sealing of the vent opening.

An example housing according to this invention includes a vent opening. The vent opening provides for the escape of gases that are generated during the curing process. The housing is provided with a cavity within which a PCB is mounted. A space above the threaded circuit board is filled with a potting material. The potting material is cured to harden and therefore protect the threaded circuit board against contamination, water intrusion, and other outside environmental elements that may affect operation of the printed circuit board. As appreciated, during the heating process heat is generated by the potting material. The heat generating by the potting material creates gases within the housing and specifically within a lower space below the printed circuit board. The housing includes the vent opening to provide a defined path within which the gas may escape. The vent opening is in communication with a protected exterior surface of the housing. In an example, the housing includes a connector pocket. The vent opening opens within the connector pocket. During operation, a connector inserted into the connector pocket includes a seal that provides a seal to the intrusion of moisture and other contaminants. In some applications it is desirable to plug up all paths to the housing cavity. This includes the opening of the vent opening to the connector pocket. However, within the connector pocket is also a terminal. Therefore, to plug the vent opening a tool or other device must be inserted into the connector pocket to inject a sealant into the vent opening. The close proximity that a tool must be placed relative to the terminal is not desirable. In some instances, the tool may cause movement of the terminal that may affect other performance.

For this reason, the housing assembly according to this invention includes a sealing access opening that is in communication of the vent opening. The sealing access opening is in communication with the vent opening on a first side and an exterior non-protected surface on another side. Once the potting material has fully cured sealant is injected into the sealant access opening to fill the vent opening. This provides an alternate channel and opening to the vent opening within which sealant may be injected. Because the sealant access opening is not within the connector pocket there is substantially no possibility of affecting the terminal position.

Accordingly, the housing and method according to this invention provides the venting required along with a means of sealing the vent opening without inserting affecting the within the connector pocket.

These and other features of the present invention can be best understood from the following specification and drawings, the following of which is a brief description.

DETAILED DESCRIPTION OF THE PREFERRED EMBODIMENT

Figure 1:
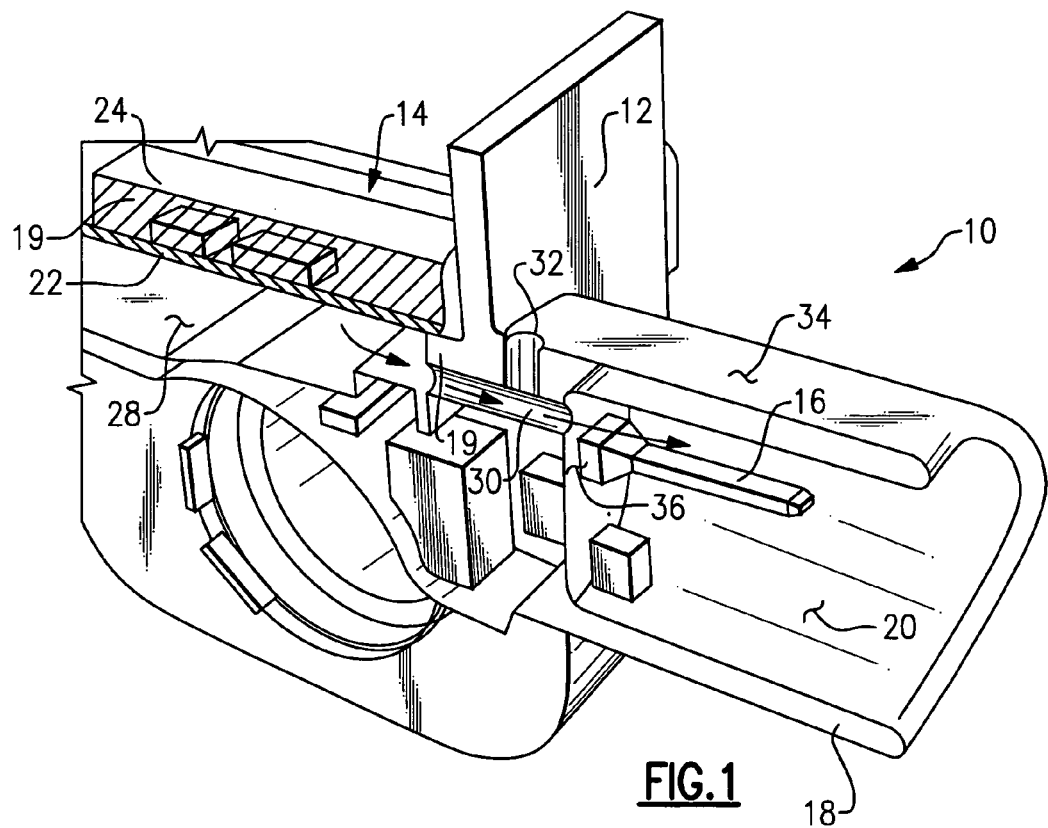
FIG. 1 is a cross-sectional view of a housing and a connector assembly according to this invention.

Referring to FIG. 1, a housing assembly 10 includes a housing 12 that defines a cavity 14. The cavity 14 is formed and configured to accept and protect a printed circuit board 22. The printed circuit board 22 is disposed and inserted within the cavity 14 and rests on a mounting ledge 19. The printed circuit board 22 defines an upper space 26 and a lower space 28 when inserted within the cavity 14.

The housing 12 includes an integral connector body 18. The connector body 18 defines a connector pocket 20. Within the connector pocket 20 is a terminal 16. In this view a single terminal 16 is shown, however, this housing configuration may include several other terminals that are disposed within the connector pocket 20. The terminal is provided within the connector pocket 20 in a desired position. This desired position is maintained to allow mating connectors to be electrically connected and communicate with the terminal 16.

The printed circuit board 22 within the cavity 14 is filled in the upper space 26 with a potting material 24. The potting material 24 may be of any composition known to a worker skilled in the art. This may include potting material that is cured with the application of heat or the potting material that is mixed just prior to the filling of the cavity 14 and that hardens due to the mixture of several components. In either case, once the potting material 24 begins curing, heat is generated. Heat generated by the potting material 24 creates gases within the cavity 14. These gases within the cavity 14 can naturally escape when in the upper space 26. However, within the lower space 28 the gases are trapped. Escape of the gases is not desirable through the potting material 24. This is because escape of gases through the potting material would create undesirable air bubbles that can degrade the protection function of the potting material 24.

A vent opening 30 is provided to exhaust gases from the lower space 28. The vent opening 30 communicates between the lower space 28 of the cavity 14 and a protected outer surface 36. The protected outer surface 36 is disposed within the connector pocket 20. As appreciated, the connector pocket 20 is not exposed once the housing 12 is inserted and installed within an automobile. This is because a mating connector will include seals that form a barrier to contaminants and moisture. However, in some applications it is desirable to plug the vent opening 30 once the potting material 24 has fully cured. Plugging of the vent opening 30 completes the seal of the cavity 14 and is therefore desirable in many applications. However, the filling of the vent opening 30 requires insertion of a tool into the connector pocket 20. In some instances, insertion of a tool within the connector pocket 20 is not desirable as it may errantly contact the terminal 16 moving it from its desired location.

Accordingly, the housing 12 of this invention includes a sealant access opening 32. This access opening allows for the insertion of sealant into the vent opening 30 without the need for inserting a tool in the connector pocket 20. The access opening 32 communicates with the vent opening 30 on one side and with a non-protected exterior surface 34 on another side.

Figure 2:
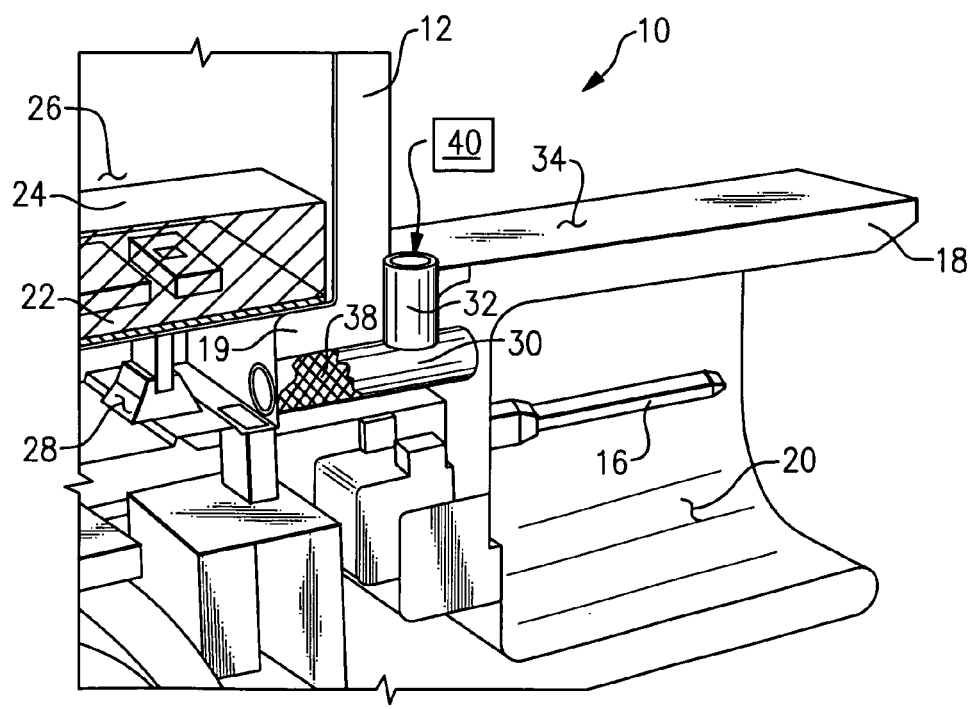
FIG. 2 is a cross-sectional view of the housing and connector assembly according to this invention with the vent opening filled with sealant.

Referring to FIG. 2, once the potting material 24 has fully cured and all gases have been allowed to escape from the space below the printed circuit board 22, a sealant 40 is injected into the access opening 32 to fill the vent opening 30. The sealant 40 provides a barrier to water intrusion, moisture and other contaminants that may adversely affect operation of the printed circuit board 22. The sealant 40 may comprise any known compound and can be of any composition or material that will flow naturally within the access opening 32 and then harden or cure such that the vent opening 30 is fully closed.

Figure 3:
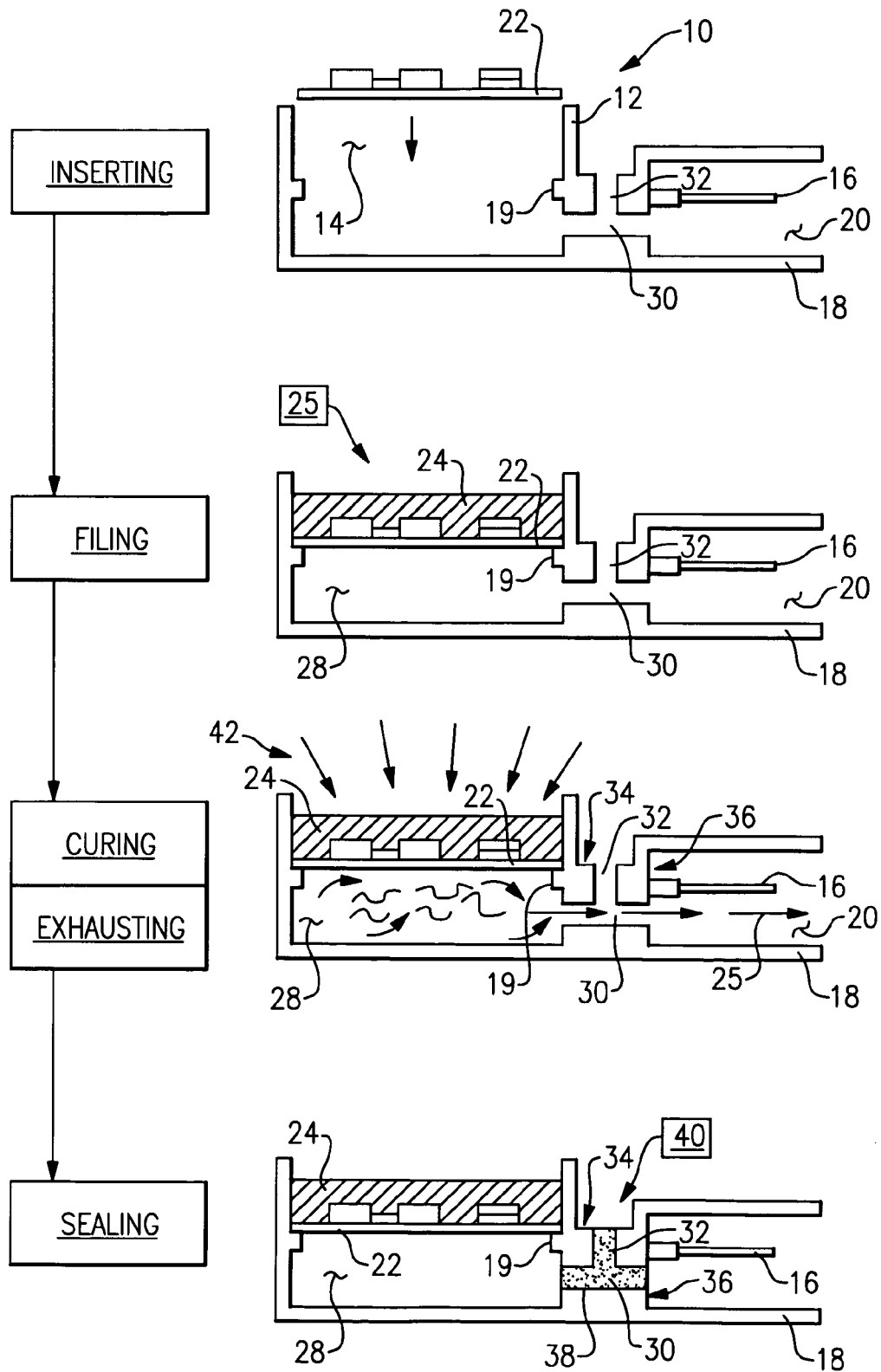
FIG. 3 is a schematic representation of the housing assembly and method according to this invention.

Referring to FIG. 3, the method according to this invention is shown schematically. The method begins with an initial step of providing a housing 12 that includes a vent opening 30 that communicates from a cavity 14 of the housing 12 to the non-exposed exterior surface 36. The housing 12 also includes the access opening 32 that communicates between the vent opening 30 and an exposed non-protected exterior surface 34. The printed circuit board 22 is inserted into the cavity 14 and rested on mounting ledge 19 or other devices that are commonly known to a worker skilled in the art to properly position the printed circuit board 22 within the housing cavity 14. Once the printed circuit board 22 is mounted as desired within the housing 12, a potting material 24 is filled over the printed circuit board 22. The printed circuit board 22 divides the cavity 14 into the upper space 26 and the lower space 28. The lower space 28 does not receive potting material and therefore is open. The open area is also in communication with the vent opening 30.

The potting material 24 is either cured by the application of heat 42 or generates heat on its own due to the chemical reactions required by mixing several components to create a hardened mixture. In any of these potting material configurations curing of the potting material 24 generates heat. This heat in turn generates gases that must be exhausted from the cavity 14. The further step, indicated at 25, includes exhausting gases from the cavity 14 through the vent opening 30 and further through the connector pocket 20. This exhausting of gases is necessary to prevent bubbling up of material through the potting material 24. Once the potting material 24 has cured to a desirable level and the gases have been exhausted from the cavity 14 the final step in the sealing of the cavity 14 is performed.

The final step includes injecting sealant material 38 within the access opening 32. The sealing access opening 32 is disposed and in communication with a non-protected outer surface 34 of the housing 12. This non-protected outer surface 34 is outside of the connector pocket 20. Accordingly, insertion of a tool into the sealing access opening 32 or adjacent the access opening 32 does not affect or come in close proximity to terminals 16 within the connector pocket 20.

Accordingly, the sealing access opening 32 provides for communication of sealant to the vent opening 30 for the easy and safe sealing of a cavity after curing of potting material without the possibility of disrupting connector components.

Although a preferred embodiment of this invention has been disclosed, a worker of ordinary skill in this art would recognize that certain modifications would come within the scope of this invention. For that reason, the following claims should be studied to determine the true scope and content of this invention.

What is claimed is:

1. A method of assembling and sealing a circuit board within a housing comprising the steps of:
   a) placing a circuit board into a housing;
   b) filling a space around the circuit board with a potting material;
   c) exhausting gases from the housing through a vent opening during curing of the potting material; and
   d) filling the vent opening through sealing access opening with a sealant, wherein the sealing access opening is transverse to the vent opening.

2. The method as recited in claim 1, including the step of communicating the vent opening with the sealing access opening.

3. The method as recited in claim 1, including the step of communicating said vent opening with a connector pocket of the housing.

4. The method as recited in claim 3, including the step of communicating the vent opening with an area outside the connector pocket through the sealing access opening.

5. The method as recited in claim 1, wherein the vent opening communicates with a space within the housing not filled with the potting material.

6. The method as recited in claim 5, wherein the space is disposed below the printed circuit board.

7. A method of sealing a housing for a printed circuit board, said method comprising the steps of:
   a) mounting a printed circuit board within a housing and defining a space below the printed circuit board and a space above the printed circuit board;
   b) filling the space above the printed circuit board with a potting material;

c) curing the potting material and exhausting heat and gases through a vent opening in communication with the space below the printed circuit board; and d) sealing the vent opening by injecting sealant into an access opening in communication with said vent opening, wherein the access opening extends transverse from the vent opening.

8. The method as recited in claim 7, wherein the access opening is in communication with said vent opening and an exposed outside surface.

9. The method as recited in claim 8, wherein the vent opening is in communication with a non-exposed outside surface.

10. The method as recited in claim 9, wherein the non-exposed outside surface comprises a surface within a connector housing.

11. The method as recited in claim 9, wherein the sealant injected into the access opening blocks the vent opening from communicating with the non-exposed outside surface.

* * * * *

UNITED STATES PATENT AND TRADEMARK OFFICE
CERTIFICATE OF CORRECTION

PATENT NO. : 7,628,948 B2 Page 1 of 1
APPLICATION NO. : 11/144282
DATED : December 8, 2009
INVENTOR(S) : Andrew J. Wisniewski It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1223 days.

Signed and Sealed this

Twenty-first Day of December, 2010

David J. Kappos
*Director of the United States Patent and Trademark Office*